(12) United States Patent
Kawabata et al.

(10) Patent No.: US 10,598,441 B2
(45) Date of Patent: Mar. 24, 2020

(54) HEAT SINK

(71) Applicant: Furukawa Electric Co., Ltd., Tokyo (JP)

(72) Inventors: Kenya Kawabata, Tokyo (JP); Masahiro Meguro, Tokyo (JP); Kuang Yu Chu, Taipei (TW); Hung Wei Tseng, Taipei (TW)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 15/813,035

(22) Filed: Nov. 14, 2017

(65) Prior Publication Data

US 2018/0080717 A1 Mar. 22, 2018

Related U.S. Application Data

(63) Continuation of application No. PCT/JP2016/077461, filed on Sep. 16, 2016.

(30) Foreign Application Priority Data

Sep. 18, 2015 (JP) .................................. 2015-185647

(51) Int. Cl.
*F28D 15/02* (2006.01)
*H01L 23/36* (2006.01)
(Continued)

(52) U.S. Cl.
CPC ..... *F28D 15/0275* (2013.01); *F28D 15/0233* (2013.01); *F28F 1/32* (2013.01);
(Continued)

(58) Field of Classification Search
CPC ............... H01L 23/427; H01L 23/3672; F28D 15/0275
(Continued)

(56) References Cited

U.S. PATENT DOCUMENTS 5,818,694 A 10/1998 Daikoku et al.
6,779,595 B1* 8/2004 Chiang ................. H01L 23/427
165/104.33
(Continued)

FOREIGN PATENT DOCUMENTS

EP 2933832 A1 10/2015
JP S53051463 A 5/1978
(Continued)

OTHER PUBLICATIONS

English Translation of International Preliminary Report on Patentability Chapter I dated Mar. 20, 2018 for PCT Application No. PCT/JP2016/077461.
(Continued)

*Primary Examiner* — Paul Alvare
(74) *Attorney, Agent, or Firm* — Dorsey & Whitney LLP

(57) ABSTRACT

A heat sink includes a base plate thermally connectable to a heat generating element and having a flat plate shape, a first heat radiating fin thermally connected to the base plate, and a second heat radiating fin disposed adjacently to a side end portion of the first heat radiating fin and thermally connected to the base plate. A surface of the first heat radiating fin is not parallel to a surface of the second heat radiating fin.

7 Claims, 10 Drawing Sheets

(51) Int. Cl.
*H01L 23/427* (2006.01)
*F28F 1/34* (2006.01)
*F28F 1/32* (2006.01)
*F28D 21/00* (2006.01)
*H01L 23/367* (2006.01)

(52) U.S. Cl.
CPC ............... *F28F 1/34* (2013.01); *H01L 23/36* (2013.01); *H01L 23/427* (2013.01); *F28D 2021/0028* (2013.01); *H01L 23/3672* (2013.01)

(58) Field of Classification Search
USPC .................................... 165/104.33; 361/700
See application file for complete search history.

(56) References Cited

U.S. PATENT DOCUMENTS

| | | | | |
|---|---|---|---|---|
| 7,228,889 | B1* | 6/2007 | Tian | H01L 23/427 165/104.34 |
| 7,277,285 | B2* | 10/2007 | Shih | F28D 15/0233 361/700 |
| 7,277,287 | B2* | 10/2007 | Chen | H01L 23/4006 165/104.33 |
| 7,447,027 | B2* | 11/2008 | Xia | H01L 23/427 257/E23.088 |
| 7,692,925 | B1* | 4/2010 | Liu | H01L 23/3672 165/104.33 |
| 2004/0050535 | A1* | 3/2004 | Malone | H01L 23/427 165/80.3 |
| 2004/0134642 | A1 | 7/2004 | Lo | |
| 2005/0006055 | A1* | 1/2005 | Colbert | H01L 23/4006 165/80.3 |
| 2011/0024088 | A1* | 2/2011 | Lin | B21D 53/085 165/104.26 |
| 2011/0100604 | A1 | 5/2011 | Anzai | |
| 2011/0108244 | A1 | 5/2011 | Anzai | |
| 2013/0175021 | A1* | 7/2013 | Takigawa | H05K 7/209 165/185 |
| 2013/0248162 | A1* | 9/2013 | Deighton | F28F 3/08 165/185 |

FOREIGN PATENT DOCUMENTS

| | | |
|---|---|---|
| JP | H07254794 A | 10/1995 |
| JP | H09223883 A | 8/1997 |
| JP | 3104468 U | 7/2004 |
| JP | 2008193007 A | 8/2008 |
| JP | 2011094888 A | 5/2011 |
| JP | 2011103384 A | 5/2011 |
| JP | 2012023146 A | 2/2012 |
| JP | 5654180 B2 | 1/2015 |
| JP | 2015164166 A | 9/2015 |
| TW | 557114 U | 10/2003 |
| TW | M276433 U | 9/2005 |
| TW | 201124691 A | 7/2011 |
| TW | 201249319 A | 12/2012 |
| TW | I398214 B | 6/2013 |

OTHER PUBLICATIONS

English Translation of the Written Opinion of the International Search Authority dated Nov. 1, 2016 for PCT Application No. PCT/JP2016/077461.
"International Search Report and Written Opinion received in PCT Application No. PCT/JP2016/077461, dated Nov. 1, 2016 (English translation of ISR)".
Office Action for Taiwanese Application No. TW105130121, dated Aug. 27, 2017 (with English Translation).
Decision to Grant a Patent for JP App. No. 2015-185647, dated Nov. 28, 2016.
Office Action for Taiwanese App. No. TW105130121, dated Mar. 30, 2018.
Office Action dated Mar. 28, 2016 of corresponding JP application No. 2015-185647.
Office Action dated Sep. 5, 2016 of corresponding JP application No. 2015-185647.
English Translation of Chinese Office Action dated Oct. 26, 2018 in the corresponding Chinese Application No. 201690001111.7.
English Translation of Office Action dated Sep. 14, 2018 in the corresponding Taiwanese Application No. 105130121.
English Translation of Office Action dated Aug. 21, 2018 in Chinese Application No. 201690001111.7.
English Translation of Decision of Refusal dated Mar. 21, 2019 of Corresponding TW Application No. 105130121.
English Translation of Notification to Grant a Patent dated Mar. 19, 2019 of Corresponding Chinese Application No. 201690001111.7.
English Translation of Notification to Grant Utility Model Patent Right received in Chinese Utility Model application No. 201821512703.2 dated Aug. 6, 2019.
English translation of Office Action for TW Application No. 105130121, dated Sep. 19, 2019.
English Translation of Decision to Grant a Patent received in TW application No. 105130121, dated Dec. 30, 2019.

* cited by examiner

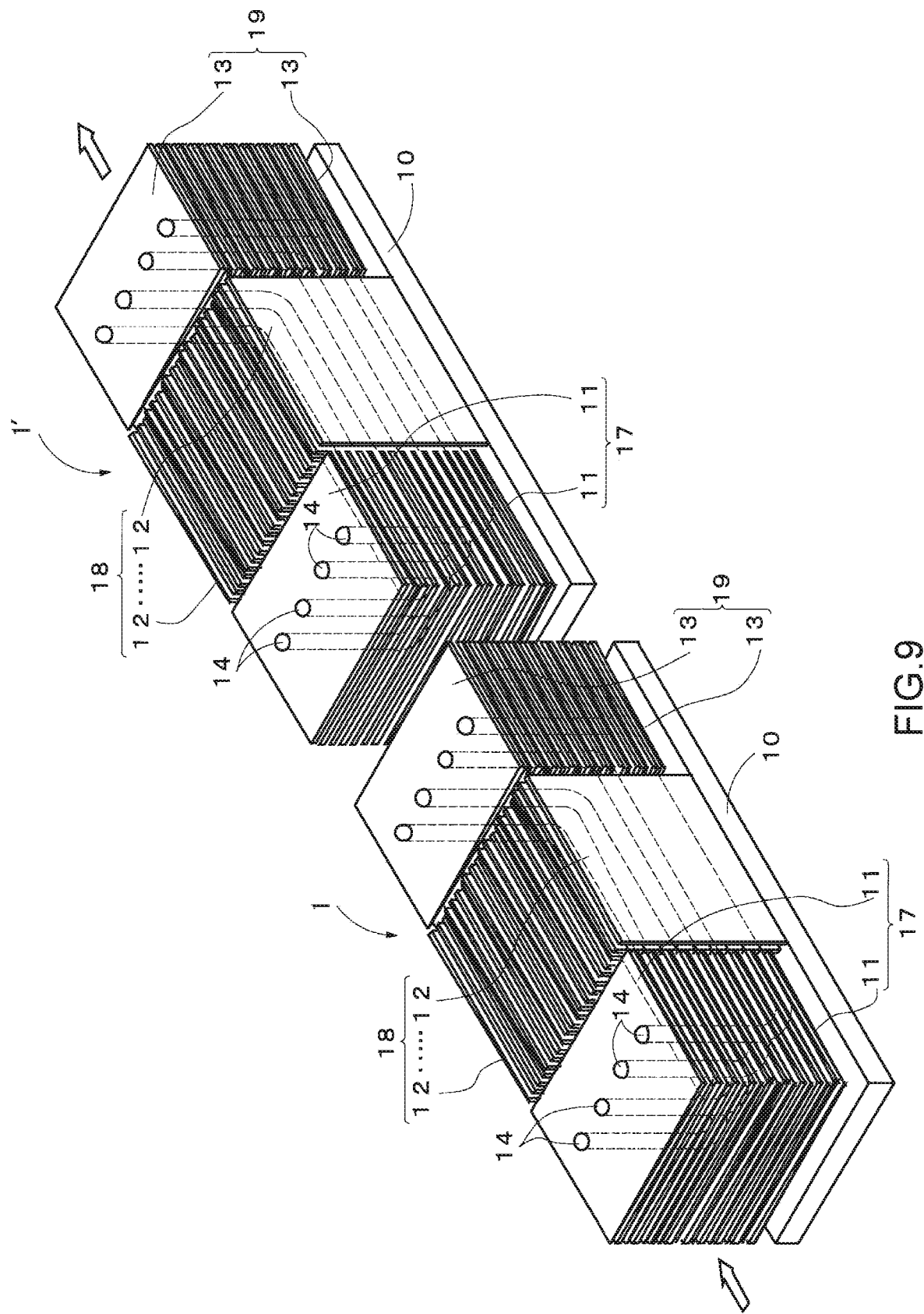

HEAT SINK

CROSS REFERENCE TO RELATED APPLICATIONS

This is a continuation application of International Patent Application No. PCT/JP2016/077461 filed Sep. 16, 2016, which claims the benefit of Japanese Patent Application No. 2015-185647, filed Sep. 18, 2015, the full contents of all of which are hereby incorporated by reference in their entirety.

BACKGROUND

Technical Field

The present disclosure relates to a heat sink for cooling a heat generating element, and more specifically relates to a heat sink for cooling an electronic component equipped in a mobile body such as a railway vehicle, an aircraft or an automobile, or on an electronic apparatus.

Background

Conventionally, as a heat sink, there has been proposed a heat radiator which includes: first heat pipes each having a first end portion, a first straight portion which is a straight pipe continuous with the first end portion, a bent portion which is a curved pipe continuous with the first straight portion, a second straight portion which is a straight pipe continuous with the bent portion and disposed parallel to the first straight portion, and a second end portion continuous with the second straight portion; a first base in contact with a circuit and having a first surface on a side opposite to the circuit which is joined to the first straight portion; a plurality of first fins each being a flat plate perpendicular to the first straight portion, intersecting with the second straight portion and arranged on the first surface; a second base having a second surface perpendicular to the first base and to the first straight portion and joined to the first heat pipe; and a plurality of second fins perpendicular to the second surface and arranged on the second surface (Japanese Laid-Open Patent Publication No. 2011-94888).

In Japanese Laid-Open Patent Publication No. 2011-94888, in addition to the first heat sink which includes the plurality of first fins, a second heat sink including the plurality of second fins arranged perpendicular to the first heat sink is also provided so as to enhance heat radiation efficiency.

However, in Japanese Laid-Open Patent Publication No. 2011-94888, the first fins each having a flat plate shape are arranged in parallel at predetermined intervals. Accordingly, there exists a problem that a boundary layer where a flow of cooling air stagnates is formed at surfaces of the first fins, thus causing a decrease in heat radiation characteristics particularly at leeward side portions of the surfaces of the first fins.

In a case where heat radiating fins having a flat plate shape are mounted on a heat pipe having a U-shape as viewed in a side view, and the heat pipe is installed such that the U-shape of the heat pipe is parallel to cooling air, for a portion of each heat radiating fin positioned between straight portions of the U-shape of the heat pipe, an area in the vicinity of a center portion of such a portion is at a distance from the straight portions of the heat pipe. Accordingly, there exists a problem that heat radiation efficiency of the heat radiating fins is lowered.

The present disclosure is related to providing a heat sink where the formation of a boundary layer on surfaces of heat radiating fins is suppressed so that excellent heat radiation efficiency is exhibited.

SUMMARY

According to an aspect of the present disclosure, a heat sink includes: a base plate thermally connectable to a heat generating element and having a flat plate shape; a first heat radiating fin thermally connected to the base plate; and a second heat radiating fin disposed adjacently to a side end portion of the first heat radiating fin and thermally connected to the base plate, wherein a surface of the first heat radiating fin is not parallel to a surface of the second heat radiating fin.

In the above-mentioned aspect, the first heat radiating fin and the second heat radiating fin are arranged in a state where the surface of the first heat radiating fin and the surface of the second heat radiating fin are not parallel to each other. That is, the second heat radiating fin is arranged such that the surface of the second heat radiating fin makes an angle of greater than 0° and less than or equal to 90° with respect to the surface of the first heat radiating fin. Accordingly, when cooling air is supplied from the first heat radiating fin side or the second heat radiating fin side, a disturbance in the flow of the cooling air is generated between the first heat radiating fin and the second heat radiating fin.

According to an aspect of the present disclosure, a heat sink where the first heat radiating fin is thermally connected to the base plate via a heat conductive member.

The term "heat conductive member" means a member having excellent thermal conductivity, and may include a heat pipe or metal (for example, aluminum, copper or the like) having thermal conductivity of greater than or equal to 100 W/(m·K) at 25° C.

According to an aspect of the present disclosure, a heat sink further includes a third heat radiating fin disposed adjacently to a side end portion of the second heat radiating fin and thermally connected to the base plate, wherein a surface of the third heat radiating fin is not parallel to the surface of the second heat radiating fin.

In the above-mentioned aspect, the second heat radiating fin and the third heat radiating fin are arranged in a state where the surface of the second heat radiating fin and the surface of the third heat radiating fin are not parallel to each other. That is, the third heat radiating fin is arranged such that the surface of the third heat radiating fin makes an angle of more than 0° and less than or equal to 90° with respect to the surface of the second heat radiating fin. Accordingly, when cooling air is supplied from the third heat radiating fin side or the first heat radiating fin side, a disturbance in the flow of the cooling air is generated between the second heat radiating fin and the third heat radiating fin.

According to an aspect of the present disclosure, a heat sink where the third heat radiating fin is thermally connected to the base plate via a heat conductive member.

According to an aspect of the present disclosure, a heat sink where the heat conductive member is a heat pipe.

According to an aspect of the present disclosure, a heat sink where a shape of the heat pipe is a U-shape as viewed in a side view, an L shape as viewed in a side view or a sideways-open U-shape as viewed in a side view.

According to an aspect of the present disclosure, a heat sink where an end portion of the second heat radiating fin is brought into direct contact with the base plate so that the second heat radiating fin is thermally connected to the base plate.

According to an aspect of the present disclosure, a heat sink where an end portion of the second heat radiating fin on a side opposite to the end portion of the second heat radiating fin brought into direct contact with the base plate is thermally connected to the base plate via a heat pipe.

According to an aspect of the present disclosure, the first heat radiating fin and the second heat radiating fin are arranged with the surface of the first heat radiating fin and the surface of the second heat radiating fin being not parallel to each other. Accordingly, when cooling air is supplied from the first heat radiating fin side or the second heat radiating fin side, the formation of a boundary layer is suppressed between the first heat radiating fin and the second heat radiating fin and hence, the lowering of heat radiation efficiency of the heat radiating fins can be prevented. Further, between the first heat radiating fins and the second heat radiating fins, a disturbance in the flow of the cooling air is generated, that is, the cooling air becomes agitated and hence, a rate of heat transfer between the heat radiating fins and the cooling air can be enhanced.

According to an aspect of the present disclosure, the first heat radiating fin is thermally connected to the base plate via the heat conductive member such as a heat pipe and hence, heat can be smoothly transported from the base plate to the first heat radiating fin.

According to an aspect of the present disclosure, the heat sink further includes the third heat radiating fin disposed adjacently to the side end portion side of the second heat radiating fin, and the second heat radiating fin and the third heat radiating fin are arranged in a state where the surface of the second heat radiating fin and the surface of the third heat radiating fin are not parallel to each other. Accordingly, when cooling air is supplied from the first heat radiating fin side or the third heat radiating fin side, the formation of a boundary layer can be suppressed not only between the first heat radiating fin and the second heat radiating fin but also between the second heat radiating fin and the third heat radiating fin and hence, the lowering of heat radiation efficiency of the heat radiating fins can be further prevented. Further, a disturbance in the flow of the cooling air is generated not only between the first heat radiating fin and the second heat radiating fin but also between the second heat radiating fin and the third heat radiating fin. Accordingly, a rate of heat transfer between the heat radiating fins and the cooling air can be further enhanced.

According to an aspect of the present disclosure, the third heat radiating fin is thermally connected to the base plate via the heat conductive member such as the heat pipe and hence, heat can be smoothly transported from the base plate to the third heat radiating fin.

According to an aspect of the present disclosure, the end portion of the second heat radiating fin is in direct contact with the base plate. Accordingly, when a heat generating element is thermally connected to the second face side of a base plate region at which the second heat radiating fin is in direct contact, heat transfer through the second heat radiating fin from the base plate side to the side opposite to the base plate can be made even smoother. Accordingly, heat radiation efficiency of the second heat radiating fins can be further enhanced.

According to an aspect of the present disclosure, the end portion of the second heat radiating fin on a side opposite to the end portion of the second heat radiating fin in direct contact with the base plate is thermally connected to the base plate via the heat pipe. Accordingly, heat transferred from the heat generating element to the base plate is not only transferred from the base plate to the base plate side of the second heat radiating fin but also transported to the side of the second heat radiating fin opposite to the base plate and hence, heat radiation efficiency of the second heat radiating fins can be further enhanced.

BRIEF DESCRIPTION OF DRAWINGS

FIG. 9 is an explanatory view of a heat sink used in Example 3.

DETAILED DESCRIPTION

Figure 1:
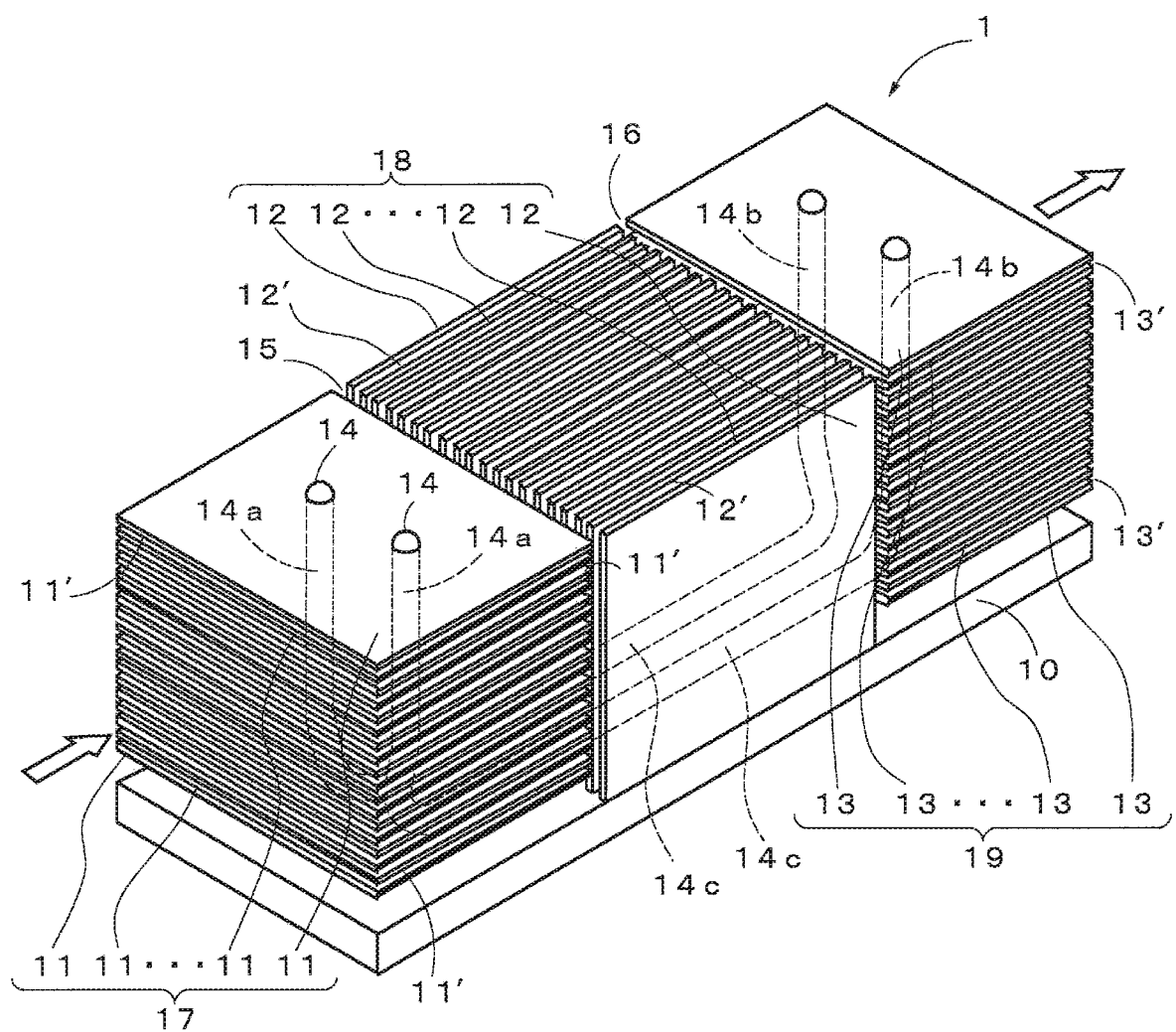
FIG. 1 is a perspective view of a heat sink according to a first embodiment of the present disclosure.
Figure 2:
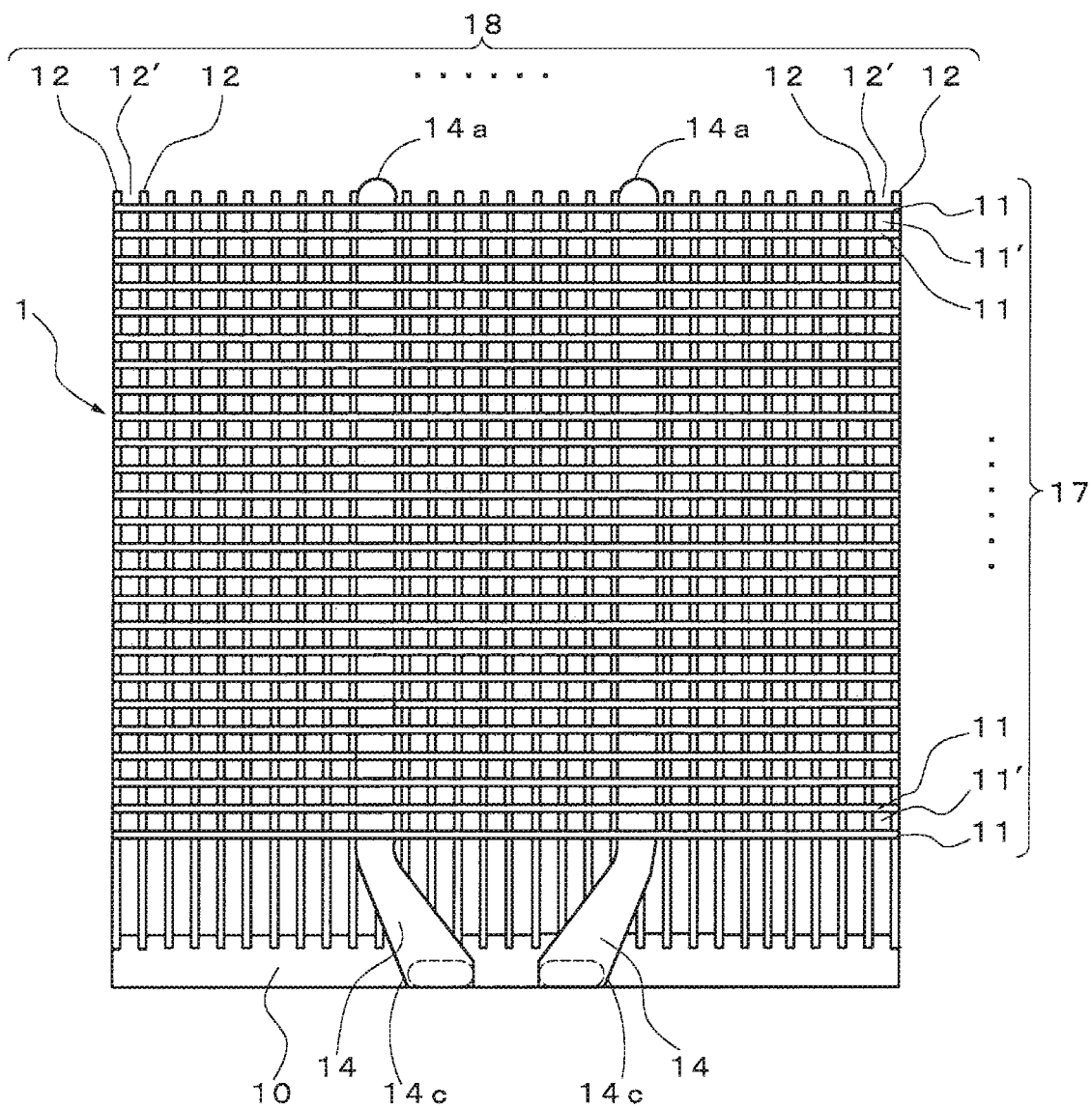
FIG. 2 is a front view of the heat sink according to the first embodiment of the present disclosure.

Further features of the present disclosure will become apparent from the following detailed description of exemplary embodiments with reference to the accompanying drawings. First, a heat sink according to a first embodiment of the present disclosure will be described with reference to the drawings. As shown in FIG. 1 and FIG. 2, the heat sink 1 according to the first embodiment includes a base plate 10, first heat radiating fins 11, second heat radiating fins 12, and third heat radiating fins 13. The base plate 10 has a first face and a second face on a side opposite to the first face. The base plate 10 is thermally connectable to a heat generating element (not shown in the drawing) at the second face (back face) side of the base plate 10 and has a flat plate shape. The first heat radiating fins 11 are thermally connected to the base plate 10 via heat pipes 14 disposed to extend from the second face side of the base plate 10 to the first face (front face) side of the base plate 10 and in a direction away from the base plate 10. The second heat radiating fins 12 are disposed adjacently to side end portions of the first heat radiating fins 11 with a first gap portion 15 between the second heat radiating fins 12 and the first heat radiating fins 12. The second heat radiating fins 12 are in direct contact with the first face side of the base plate 10 and thus thermally connected to the base plate 10. The third heat radiating fins 13 are disposed adjacently to side end portions of the second heat radiating fins 12 with a second gap portion 16 between the third heat radiating fins 13 and second heat radiating fins 12, and the third heat radiating fins 13 are thermally connected to the base plate 10 via the heat pipes 14 disposed to extend from the second face side of the base plate 10 to the first face side of the base plate 10 and in a direction away from the base plate 10.

A first heat radiating fin group 17 includes a plurality of first heat radiating fins 11. A second heat radiating fin group 18 includes a plurality of second heat radiating fins 12. A third heat radiating fin 19 includes a plurality of third heat radiating fin 13. The first heat radiating fin group 17, the second heat radiating fin group 18 and the third heat radiating fin group 19 are mutually arranged in a straight line on the base plate 10.

As for the heat sink 1, each first heat radiating fin 11 has a flat plate shape. The first heat radiating fins 11 are arranged at regular intervals in a vertical direction with respect to the first face of the base plate 10, and further, the first heat radiating fins 11 are arranged such that surfaces of the first heat radiating fins 11 are parallel to the first face of the base plate 10. In this manner, one first heat radiating fin group 17 is formed. That is, a fin pitch of the first heat radiating fin group 17 is regularly spaced. Accordingly, a first space 11' having a certain width extends parallel to the first face of the base plate 10 between respective first heat radiating fins 11.

As for the heat sink 1, a plurality of (two in the drawing) heat pipes 14 are disposed to extend from the second face side of the base plate 10 to the first face side of the base plate 10 and in the direction away from the base plate 10 such that the heat pipes 14 are arranged side by side in a parallel relationship. Each heat pipe 14 has a U-shape as viewed in a side view. Accordingly, the heat pipe 14 having a U-shape as viewed in a side view includes two straight portions facing each other, that is, one straight portion 14a and the other straight portion 14b, and the heat pipe 14 further includes a bottom portion 14c between one straight portion 14a and the other straight portion 14b.

The bottom portions 14c of the heat pipes 14 having a U-shape as viewed in a side view are in direct contact with the base plate 10 so that the heat pipes 14 having a U-shape as viewed in a side view are thermally connected to the base plate 10. As for the heat sink 1, the bottom portions 14c of the heat pipes 14 having a U-shape as viewed in a side view are fitted in recessed grooves formed on the second face side of the base plate 10 so that the heat pipes 14 having a U-shape as viewed in a side view are thermally connected to the base plate 10.

The first heat radiating fins 11 are mounted on one straight portion 14a of the heat pipes 14 having a U-shape as viewed in a side view. The first heat radiating fins 11 are in direct contact with one straight portion 14a of the heat pipes 14 having a U-shape as viewed in a side view so that the first heat radiating fins 11 are thermally connected to the heat pipes 14 having a U-shape as viewed in a side view. Thus, the first heat radiating fins 11 are thermally connected to the base plate 10 via the heat pipes 14 having a U-shape as viewed in a side view. Accordingly, the first heat radiating fin group 17 is arranged at one end portion side of the heat sink 1.

The second heat radiating fins 12 are arranged at the first face side of the base plate 10 in a region where the bottom portions 14c of the heat pipes 14 having a U-shape as viewed in a side view are attached, that is, at a center portion of the heat sink 1. Each second heat radiating fin 12 has a flat plate shape, and an end portion of each second heat radiating fin 12 is attached to the first face side of the base plate 10. The end portions of the second heat radiating fins 12 are in direct contact with the base plate 10, and thus the second heat radiating fins 12 are thermally connected to the base plate 10. A method for attaching the second heat radiating fins 12 to the first face side of the base plate 10 may include, for example, a method in which the end portions of the second heat radiating fins 12 are joined to the first face side of the base plate 10 by soldering or the like, a method in which the end portions of the second heat radiating fins 12 are fitted in recessed grooves formed on the first face side of the base plate 10 or other methods, but not particularly limited thereto.

As for the heat sink 1, a plurality of second heat radiating fins 12 are arranged at regular intervals in a direction parallel to the first face of the base plate 10. Further, the second heat radiating fins 12 are arranged such that surfaces of the second heat radiating fins 12 are vertical with respect to the first face of the base plate 10, and also extends in a direction parallel to the direction in which the first heat radiating fin group 17, the second heat radiating fin group 18 and the third heat radiating fin group 19 are arranged. In this manner, one second heat radiating fin group 18 is formed. A fin pitch of the second heat radiating fin group 18 is regularly spaced. Accordingly, a second space 12' having a certain width extends vertically with respect to the first face of the base plate 10 between respective second heat radiating fins 12.

The second heat radiating fins 12 are arranged in a region where the bottom portions 14c of the heat pipes 14 having a U-shape as viewed in a side view are attached so that the second heat radiating fin group 18 is arranged at the center portion of the heat sink 1. The second heat radiating fins 12 are arranged such that second spaces 12' formed between the second heat radiating fins 12 face first spaces 11' formed between the first heat radiating fins 11. Side end portions of the first heat radiating fins 11 on the second heat radiating fin group 18 side and side end portions of the second heat radiating fins 12 on the first heat radiating fin group 17 side face each other with the first gap portion 15 therebetween.

When the end portions of the second heat radiating fins 12 are brought into direct contact with the first face side of the base plate 10 and thus a heat generating element is thermally connected to the second face side of the center portion of the base plate 10, heat is smoothly transferred through the second heat radiating fins 12 from the base plate 10 side, that is, from the bottom portion side of the second heat radiating fins 12 to the side opposite of the base plate 10, that is, to the top portion side of the second heat radiating fins 12. As a result, the second heat radiating fins 12 exhibit excellent heat radiation effect.

As shown in FIG. 2, the second heat radiating fins 12 are provided such that the surfaces of the second heat radiating fins 12 extend in a direction orthogonal to the surfaces of the first heat radiating fins 11. Accordingly, the first heat radiating fins 11 and the second heat radiating fins 12 are disposed in a lattice arrangement as viewed in a front view. Further, a direction in which the first spaces 11' formed between the first heat radiating fins 11 extends is a direction orthogonal to a direction in which the second spaces 12' formed between the second heat radiating fins 12 extends. In a configuration shown in FIG. 2, in order to enhance thermal connectivity between the heat generating element disposed at the center portion of the base plate 10 and the heat pipes 14 having a U-shape as viewed in a side view, the bottom portion 14c of each heat pipe 14 having a U-shape as viewed in a side view is bent in the direction toward the center portion of the base plate 10.

As shown in FIG. 1, the third heat radiating fins 13, which are heat radiating fins each having a flat plate shape, are mounted on the other straight portions 14b of the heat pipes 14 having a U-shape as viewed in a side view. Accordingly, the third heat radiating fins 13 are arranged on the other end portion side of the heat sink 1. The third heat radiating fins 13 are in direct contact with the other straight portions 14b of the heat pipes 14 having a U-shape as viewed in a side view, and thus the third heat radiating fins 13 are thermally connected to the heat pipes 14 each having a U-shape as viewed in a side view. Thus, the third heat radiating fins 13 are thermally connected to the base plate 10 via the heat pipes 14 having a U-shape as viewed in a side view.

As for the heat sink 1, a plurality of third heat radiating fins 13 are arranged at regular intervals in the vertical direction with respect to the first face of the base plate 10. Further, the third heat radiating fins 13 are arranged such that surfaces of the third heat radiating fins 13 are parallel to the first face of the base plate 10. In this manner, one third heat radiating fin group 19 is formed. That is, a fin pitch of the third heat radiating fin group 19 is regularly spaced. Accordingly, a third space 13' having a certain width extends parallel to the first face of the base plate 10 between respective third heat radiating fins 13.

The third heat radiating fins 13 are arranged on the other end portion side of the heat sink 1, and thus the third heat radiating fin group 19 is arranged on the other end portion side of the heat sink 1. The third heat radiating fins 13 are arranged such that the third spaces 13' formed between the third heat radiating fins 13 face the second spaces 12' formed between the second heat radiating fins 12. The side end portions of the second heat radiating fins 12 on the side of the third heat radiating fin group 19 and side end portions of the third heat radiating fins 13 on the side of the second heat radiating fin group 18 face each other with the second gap portion 16 therebetween.

The third heat radiating fins 13 are arranged such that surfaces of the third heat radiating fins 13 extend in a direction orthogonal to the surfaces of the second heat radiating fins 12. Accordingly, the second heat radiating fins 12 and the third heat radiating fins 13 are disposed in a lattice arrangement as viewed in a back view. Further, a direction in which the second spaces 12' formed between the second heat radiating fins 12 extends is a direction orthogonal to a direction in which the third spaces 13' formed between the third heat radiating fins 13 extends.

The third heat radiating fins 13 are also arranged such that the surfaces of the third heat radiating fins 13 extend in a direction parallel to the surfaces of the first heat radiating fins 11. The direction in which the third spaces 13' each formed between two third heat radiating fins 13 extends and the direction in which the first spaces 11' each formed between two first heat radiating fins 11 extends are parallel to each other.

Each of the first heat radiating fins 11, the second heat radiating fins 12, the third heat radiating fins 13 and the base plate 10 is a flat plate of a metal material having favorable thermal conductivity, and is made of aluminum, an aluminum alloy, copper, a copper alloy or the like. A container material for the heat pipe 14 having a U-shape as viewed in a side view is manufactured using a metal material substantially equivalent to a metal material for forming the first heat radiating fins 11, the second heat radiating fins 12, the third heat radiating fins 13 and the base plate 10. As a working fluid for the heat pipe 14 having a U-shape as viewed in a side view, a working fluid having compatibility with the container material is sealed in the heat pipe 14 in a reduced-pressure state. The working fluid may include, for example, water, alternative chlorofluorocarbon, perfluorocarbon, cyclopentane or the like.

Cooling air is supplied to the heat sink 1 from the first heat radiating fin group 17 side or the third heat radiating group 19 side in a direction in which the first heat radiating fin group 17, the second heat radiating fin group 18 and the third heat radiating fin group 19 are arranged and in a direction parallel to or a direction substantially parallel to the first face of the base plate 10. FIG. 1 shows a configuration in which cooling air is supplied from the first heat radiating fin group 17 side toward the third heat radiating fin group 19 side, that is, cooling air is supplied from one end portion side of the heat sink 1 toward the other end portion side of the heat sink 1. With the heat sink 1, the formation of a boundary layer is suppressed between the first heat radiating fins 11 and the second heat radiating fins 12 and between the second heat radiating fins 12 and the third heat radiating fins 13, and hence, a decrease in heat radiation efficiency of the heat radiating fins can be prevented. Further, cooling air is agitated between the first heat radiating fins 11 and the second heat radiating fins 12 and between the second heat radiating fins 12 and the third heat radiating fins 13, and hence, a rate of heat transfer between the heat radiating fins and the cooling air can be enhanced.

As shown in FIG. 1 and FIG. 2, the first heat radiating fins 11 are not attached to a bent portion of each heat pipe 14 having a U-shape as viewed in a side view which is disposed between one straight portion 14a and the bottom portion 14c, and the third heat radiating fins 13 are not attached to a bent portion of each heat pipe 14 which is disposed between the other straight portion 14b and the bottom portion 14c. Accordingly, cooling air is smoothly supplied to the bottom portion side of the second heat radiating fins 12 and an area around the bottom portions of the second heat radiating fins 12.

Further, with the heat sink 1, the formation of the boundary layer can be suppressed and thus a decrease in heat radiation efficiency of the heat radiating fins disposed between one straight portion 14a and the other straight portions 14b can be also prevented. Accordingly, the size of the bottom portion 14c of the heat pipe 14 having a U-shape as viewed in a side view can be increased and, as a result, it is possible to reduce a thermal resistance between the base plate 10 and the heat pipe 14 having a U-shape as viewed in a side view.

Next, a heat sink according to a second embodiment of the present disclosure will be described with reference to the drawings. Constituent elements of the heat sink according to the second embodiment substantially equivalent to the constituent elements of the heat sink according to the first embodiment are described using the same reference symbols as the constituent elements of the heat sink according to the first embodiment.

Figure 3:
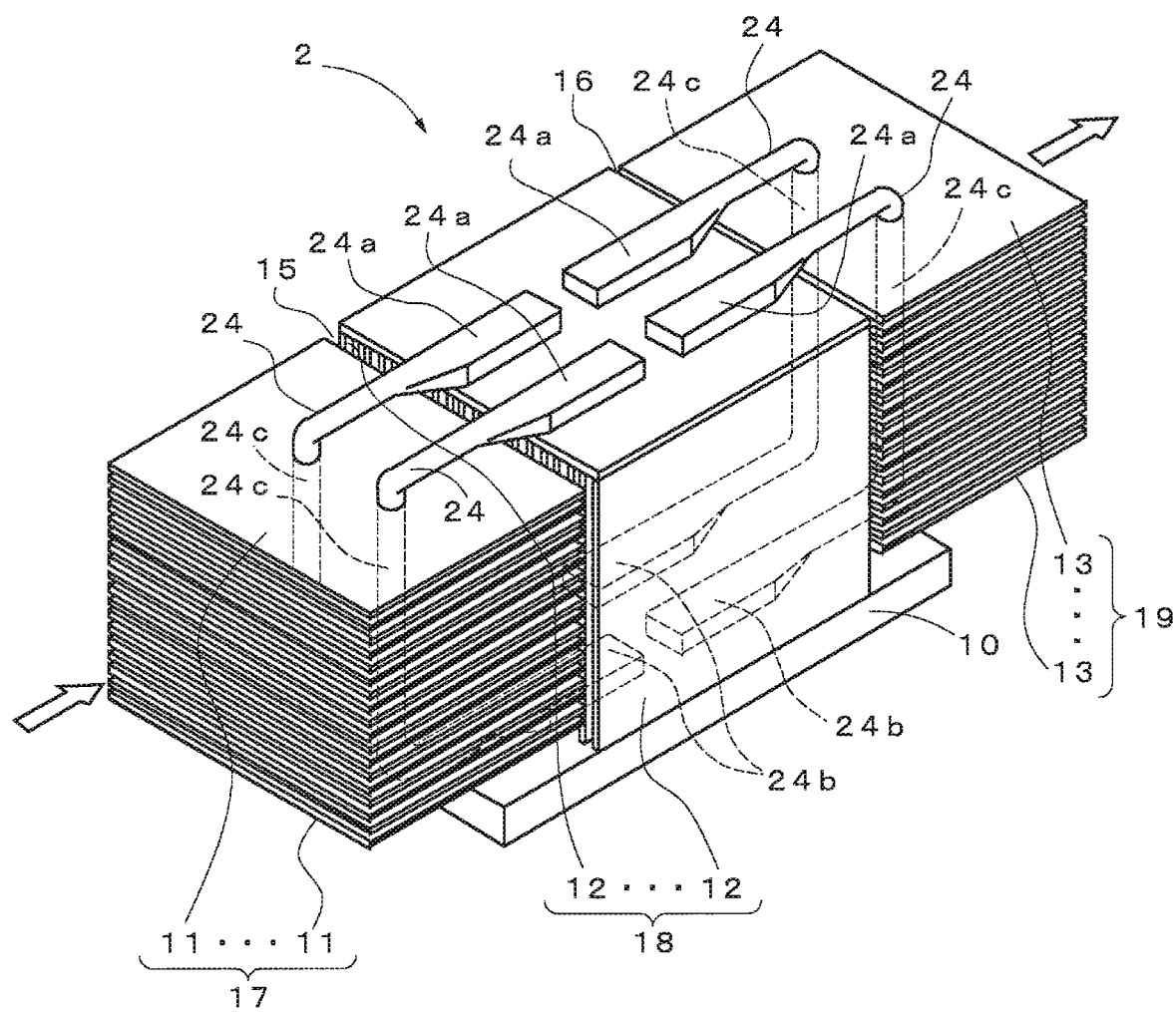
FIG. 3 is a perspective view of a heat sink according to a second embodiment of the present disclosure.

As shown in FIG. 3, the heat sink 2 according to the second embodiment includes heat pipes 24 having a sideways-open U-shape as viewed in a side view, in place of the heat pipes having a U-shape as viewed in a side view. Each heat pipe 24 having a sideways-open U-shape as viewed in a side view includes two straight portions which face each other, that is, a top straight portion 24a and a bottom straight portion 24b. Each heat pipe 24 further includes a straight side portion 24c between the top straight portion 24a and the bottom straight portion 24b. As for the heat sink 2, a plurality of (four in the drawing) heat pipes 24 having a sideways-open U-shape as viewed in a side view are provided. Further, two heat pipes 24 having a sideways-open U-shape as viewed in a side view are disposed to extend from the second face side of the base plate to the first face side of a base plate 10 and in a direction away from the base plate 10 such that the heat pipes 24 are arranged side by side in a parallel relationship. Two heat pipes 24 and other two heat pipes 24 are arranged to face each other. Accordingly, in this configuration, the side portions 24c are not disposed to extend from a center portion of the heat sink 2, but are disposed to extend from one end portion side and the other end portion side of the heat sink 2.

The bottom straight portions 24b of the heat pipes 24 having a sideways-open U-shape as viewed in a side view are brought into direct contact with the base plate 10 so that the heat pipes 24 having a sideways-open U-shape as viewed in a side view are thermally connected to the base plate 10. As for the heat sink 2, the bottom straight portions 24b of the heat pipes 24 having a sideways-open U-shape as viewed in a side view are fitted in recessed grooves formed on the second face side of the base plate 10 so that the heat pipes 24 having a sideways-open U-shape as viewed in a side view are thermally connected to the base plate 10.

A plurality of first heat radiating fins 11 are attached to the side portions 24c disposed to extend from one end portion side of the heat sink 2 thus forming a first heat radiating fin group 17. Further, a plurality of third heat radiating fins 13 are attached to the side portions 24c disposed to extend from the other end portion side of the heat sink 2 thus forming the third heat radiating fin group 19.

Further, a plurality of second heat radiating fins 12 are mounted on the base plate 10 thus forming a second heat radiating fin group 18. The top straight portions 24a of the heat pipes 24 having a sideways-open U-shape as viewed in a side view are thermally connected to a top portion of the second heat radiating fin group 18. Accordingly, the side (that is, the top portion side) of the second heat radiating fin group 18 opposite to the side (that is, the bottom portion side) of the second heat radiating fin group 18 where the second heat radiating fin group 18 is in direct contact with the base plate 10 is thermally connected to the base plate 10 via the heat pipes 24 having a sideways-open U-shape as viewed in a side view.

With the heat sink 2, heat transferred from a heat generating element not shown in the drawing to the base plate 10 is not only transferred from the base plate 10 to the bottom portion side of the second heat radiating fin group 18 but also transported from the base plate 10 to the top portion side of the second heat radiating fin group 18 through the heat pipes 24 having a sideways-open U-shape as viewed in a side view. Accordingly, heat radiation efficiency of the second heat radiating fin group 18 can be further enhanced.

Next, a heat sink according to a third embodiment of the present disclosure will be described with reference to the drawings. Constituent elements of the heat sink according to the third embodiment that are substantially equivalent to constituent elements of the heat sink according to the first embodiment will be described using the same reference symbols as the constituent elements of the heat sink according to the first embodiment.

Figure 4:
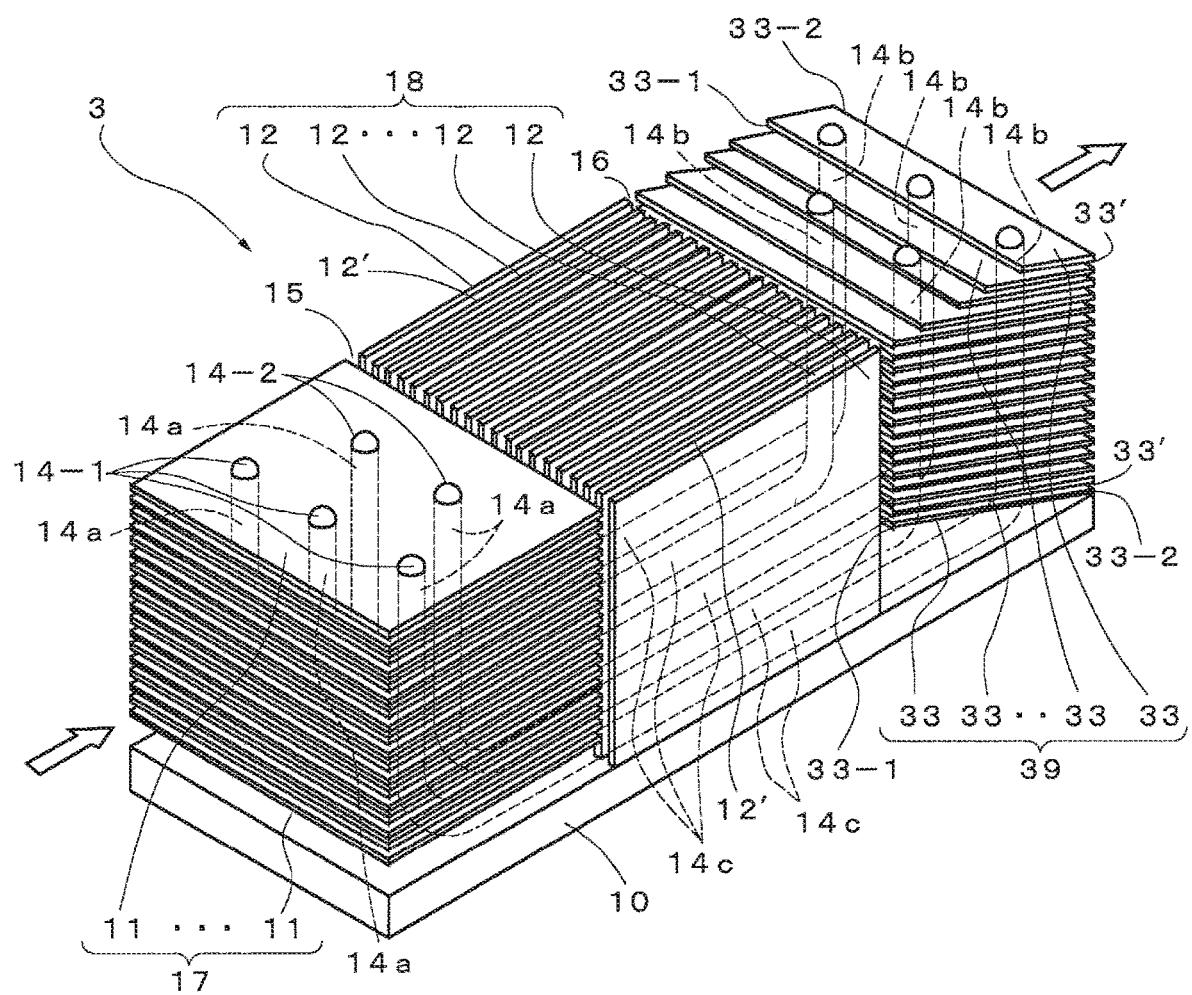
FIG. 4 is a perspective view of a heat sink according to a third embodiment of the present disclosure.

As shown in FIG. 4, in the heat sink 3 according to the third embodiment, instead of arranging third heat radiating fins such that surfaces of the third heat radiating fins are parallel to the first face of the base plate, the third heat radiating fins are arranged such that third spaces 33' formed between third heat radiating fins 33 face the second spaces 12' formed between the second heat radiating fins 12, and the surfaces of the third heat radiating fins 33 are not parallel to the first face of the base plate 10. As for each third heat radiating fin 33 of the heat sink 3, a side end portion 33-1 disposed on the side which faces the second heat radiating fin group 18 is disposed at a position higher than a side end portion 33-2 disposed on the side opposite to the side end portion 33-1. That is, the side end portion 33-2 of each third heat radiating fin 33 is at a position closer to the base plate 10 side than a position of the side end portion 33-1.

An angle which a surface of each third heat radiating fin 33 makes with respect to the first face of the base plate 10 is not particularly limited. However, for the cooling air to flow smoothly between the second spaces 12' and the third spaces 33', the angle is set at approximately 30° in FIG. 4.

As for the heat sink 3, a plurality of third heat radiating fins 33 are arranged at regular intervals in a vertical direction with respect to the first face of the base plate 10 thus forming one group of third heat radiating fins 39. A fin pitch of the group of third heat radiating fins 39 is regularly spaced. Accordingly, the third space 33' having a certain width and formed between respective third heat radiating fins 33 extends toward the first face side of the base plate 10 as the distance from the second heat radiating fin group 18 increases. As for the heat sink 3, five heat pipes 14 having a U-shape as viewed in a side view are provided. The heat pipes 14 having a U-shape as viewed in a side view include two kinds of heat pipes. That is, the heat pipes 14 include: heat pipes 14-1 each having a U-shape as viewed in a side view and including a long bottom portion 14c; and heat pipes 14-2 each having a U-shape as viewed in a side view and including a short bottom portion 14c. The heat pipes 14-1 each having a U-shape as viewed in a side view and including the long bottom portion 14c and the heat pipes 14-2 each having a U-shape as viewed in a side view and including the short bottom portion 14c are disposed to extend side by side in a parallel relationship such that the heat pipes 14-1 and the heat pipes 14-2 are disposed adjacently to each other. Accordingly, one straight portion 14a is arranged in a staggered manner, and the other straight portions 14b are also arranged in a staggered manner.

The third spaces 33' extend toward the first face side of the base plate 10 as the distance from the second heat radiating fin group 18 increases. Accordingly, in the case where cooling air is supplied from the first heat radiating fin group 17 side of the heat sink 3 toward the group of third heat radiating fins 39 and a member to be cooled, which has a short height, is arranged at the leeward side of the heat sink 3, not only a heat generating element (not shown in the drawing) thermally connected to the base plate 10 of the heat sink 3 but also the member to be cooled, which has a short height, and arranged on the leeward side of the heat sink 3, can be cooled by the cooling air.

Next, a heat sink according to a fourth embodiment of the present disclosure will be described with reference to the drawings. Constituent elements of the heat sink according to the fourth embodiment that are substantially equivalent to the constituent elements of the heat sink according to the first embodiment will be described using the same reference symbols as the constituent elements of the heat sink according to the first embodiment.

Figure 5:
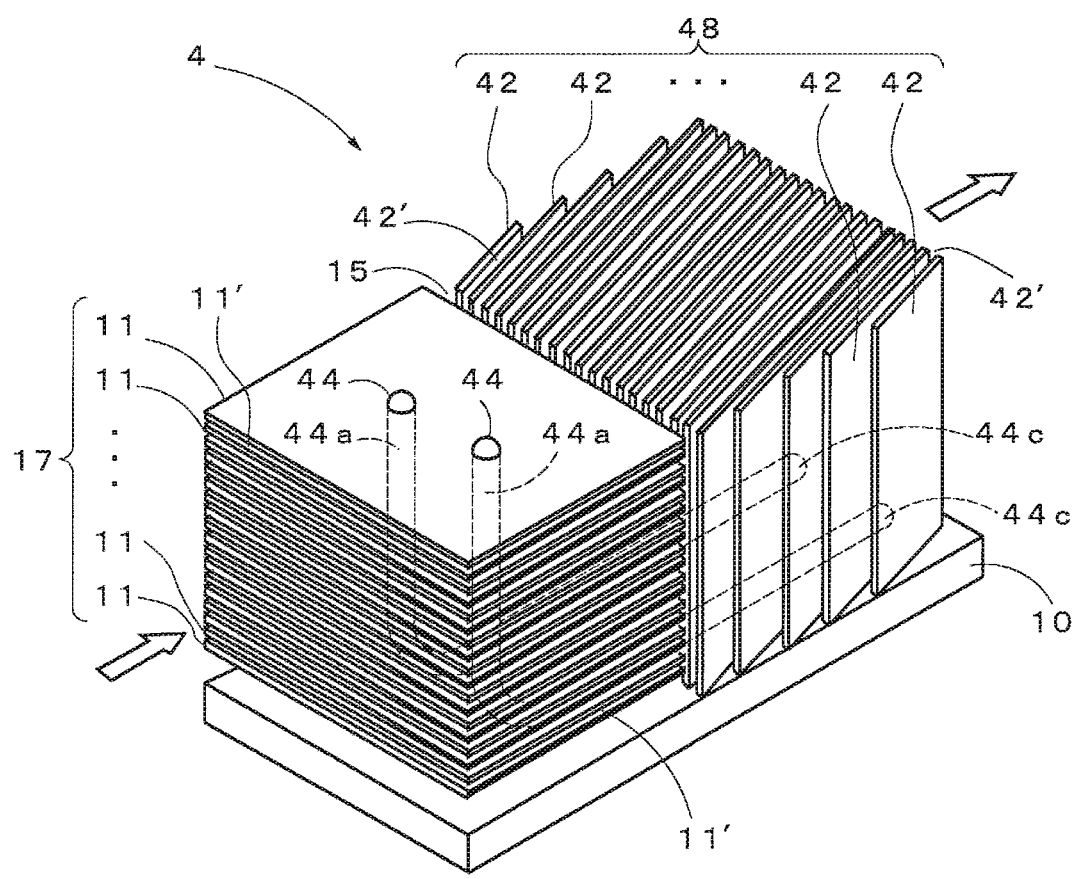
FIG. 5 is a perspective view of a heat sink according to a fourth embodiment of the present disclosure.

As shown in FIG. 5, in the heat sink 4 according to the fourth embodiment, heat pipes 44 having an L shape as viewed in a side view are used in place of the heat pipes having a U-shape as viewed in a side view. Accordingly, the heat sink 4 is not provided with a third heat radiating fin group. In place of the heat sink according to the first embodiment in which the second heat radiating fins are arranged such that the surfaces of the second heat radiating fins extend in the direction parallel to the arrangement direction of the group of first heat radiating fins, the group of second heat radiating fins and the group of third heat radiating fins, the heat sink 4 includes second heat radiating fins 42 that are arranged such that second spaces 42' formed between the second heat radiating fins 42 face first spaces 11' formed between the first heat radiating fins 11, and surfaces of the second heat radiating fins 42 extend in a direction which is not parallel to the direction in which a first heat radiating fin group 17 and a second heat radiating fin group 48 are arranged.

The angle the surface of each second heat radiating fin 42 makes with respect to the above-mentioned arrangement direction is not particularly limited. However, in order to provide a smooth flow of cooling air between the first spaces 11' and the second spaces 42', the angle is approximately 30° in FIG. 5.

As to the heat sink 4, a plurality of (two in the drawing) heat pipes 44 having an L shape as viewed in a side view are disposed to extend from the second face side of the base plate 10 to the front surface side of the base plate 10 and in a direction away from the base plate 10 such that the heat pipes 44 are arranged side by side in a parallel relationship. Each heat pipe 44 having an L shape as viewed in a side view includes one straight portion 44a and one bottom portion 44c.

The bottom portions 44c of the heat pipes 44 having an L shape as viewed in a side view are brought into direct contact with the base plate 10 so that the heat pipes 44 having an L shape as viewed in a side view are thermally connected to the base plate 10. As to the heat sink 4, the bottom portions 44c of the heat pipes 44 having an L shape as viewed in a side view are fitted in a recessed groove formed on the second face side of the base plate 10 so that the heat pipes 44 having an L shape as viewed in a side view are thermally connected to the base plate 10.

The first heat radiating fins 11 are attached to the straight portions 44a of the heat pipes 44 having an L shape as viewed in a side view. The plurality of first heat radiating fins 11 are attached to the straight portions 44a of the heat pipes 44 having an L shape as viewed in a side view thus forming a first heat radiating fin group 17. As to the heat sink 4, the first heat radiating fin group 17 is arranged at a portion of the heat sink 4 between a center portion of the heat sink 4 and one end portion side of the heat sink 4.

As to the heat sink 4, the second heat radiating fins 42 are arranged such that surfaces of the second heat radiating fins 42 are vertical with respect to the first face of the base plate 10. The group of second heat radiating fins 48 is arranged at a portion of the heat sink 4 between the center portion of the heat sink 4 and the other end portion side of the heat sink 4.

Even if two groups of heat radiating fins are provided and the second heat radiating fins 42 are arranged such that surfaces of the second heat radiating fins 42 extend in a direction which is not parallel to the arrangement direction of the first heat radiating fin group 17 and the group of second heat radiating fins 48, the formation of a boundary layer is suppressed between the first heat radiating fins 11 and the group of second heat radiating fins 42. Accordingly, a decrease in heat radiation efficiency of the heat radiating fins can be prevented. Further, a disturbance in the flow of cooling air is generated between the first heat radiating fins 11 and the second heat radiating fins 42 and hence, a rate of heat transfer between the heat radiating fins and the cooling air can be enhanced.

Further, in a case where cooling air is supplied from the first heat radiating fin group 17 side of the heat sink 4 to the direction toward the group of second heat radiating fins 48, and a member to be cooled is arranged on the oblique leeward side of the heat sink 4, not only a heat generating element (not shown in the drawing) thermally connected to the base plate 10 of the heat sink 4 but also the member to be cooled arranged on the oblique leeward side of the heat sink 4 can be cooled by the cooling air.

Next, a heat sink according to a fifth embodiment of the present disclosure will be described with reference to drawings. Constituent elements of the heat sink according to the fifth embodiment that are substantially equivalent to the constituent elements of the heat sink according to the first embodiment will be described using the same reference symbols as the constituent elements of the heat sink according to the first embodiment.

Figure 6:
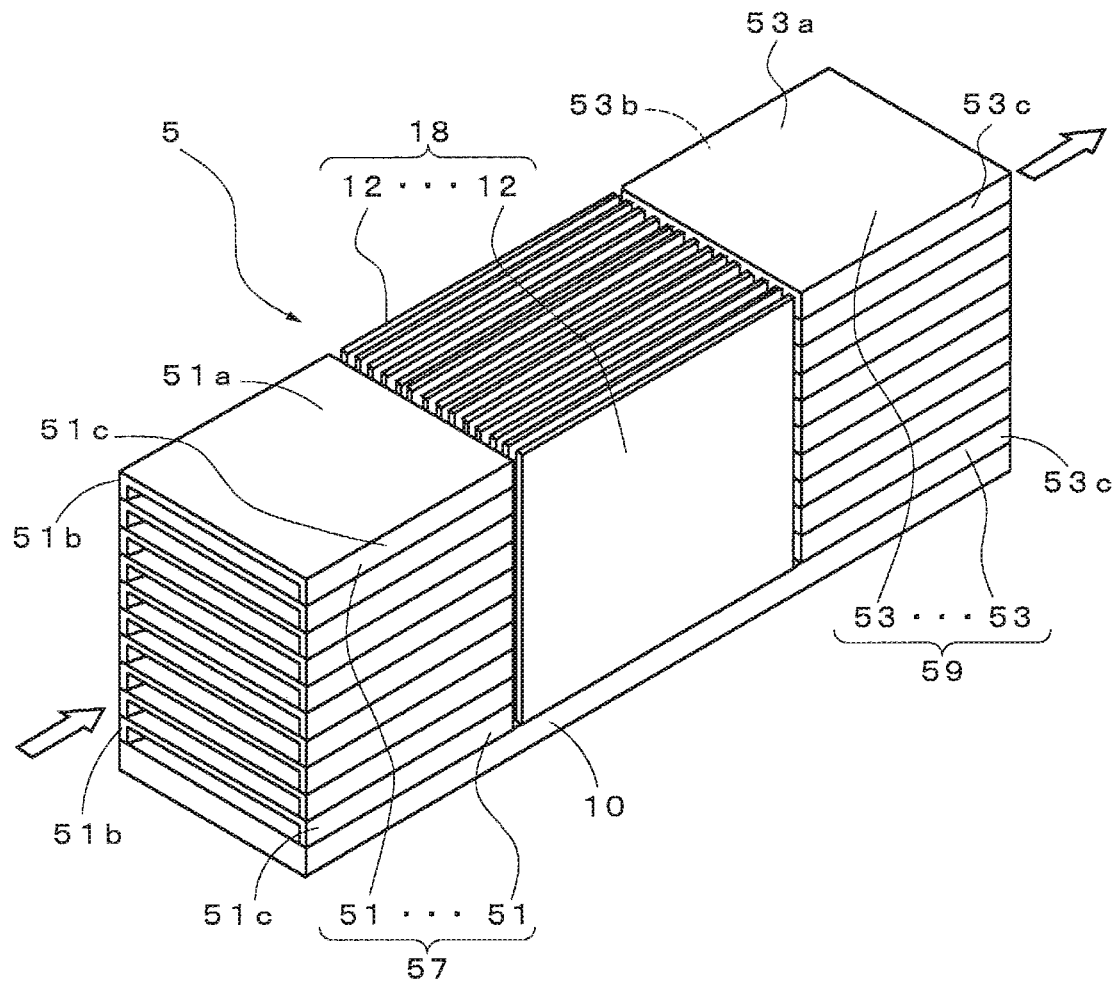
FIG. 6 is a perspective view of a heat sink according to a fifth embodiment of the present disclosure.

As shown in FIG. 6, in the heat sink 5 according to the fifth embodiment, no heat pipes are provided, and first heat radiating fins 51 and third heat radiating fins 53 are directly thermally connected to the base plate 10 without the connection of a heat conductive member such as a heat pipe.

Each of the first heat radiating fins 51 is formed of a flat-plate-shaped fin portion 51a and leg portions 51b, 51c disposed to extend substantially perpendicularly to the flat-plate-shaped fin portion 51a at both edge portions of the flat-plate-shaped fin portion 51a. The plurality of first heat radiating fins 51 are stacked thus forming a first heat radiating fin group 57. The group of first heat radiating fins 57 is arranged such that cooling air flows through each space defined between the leg portion 51b and the leg portion 51c. The flat-plate-shaped fin portions 51a are arranged at regular intervals in a vertical direction with respect to the first face of the base plate 10 (that is, at intervals of a length of the leg portion 51b, 51c). Further, the flat-plate-shaped fin portions 51a are arranged such that surfaces of the flat-plate-shaped fin portions 51a are parallel to the first face of the base plate 10. As to the heat sink 5, the leg portions 51b, 51c of the first heat radiating fins 51 are thermally connected to the base plate 10.

Each of the third heat radiating fins 53 is formed of a flat-plate-shaped fin portion 53a and leg portions 53b, 53c disposed to extend substantially perpendicularly to the flat-plate-shaped fin portion 53a at both edge portions of the flat-plate-shaped fin portion 53a. The plurality of third heat radiating fins 53 are stacked thus forming a third heat radiating fin group 59. The group of third heat radiating fins 59 is arranged such that cooling air flows through each space defined between the leg portion 53b and the leg portion 53c. The flat-plate-shaped fin portions 53a are arranged at regular intervals in the vertical direction with respect to the first face of the base plate 10 (that is, at intervals of a length of the leg portion 53b, 53c). Further, the flat-plate-shaped fin portions 53a are arranged such that surfaces of the flat-plate-shaped fin portions 53a are parallel to the first face of the base plate 10. As for the heat sink 5, the leg portions 53b, 53c of the third heat radiating fins 53 are thermally connected to the base plate 10.

Next, an example of a method for using the heat sink according to the present disclosure will be described. Here, the description is made using the heat sink 1 according to the first embodiment. For a case where cooling air is supplied from the side of the first heat radiating fin group 17 to the heat sink 1, the heat sink 1 is installed such that the flow direction of the cooling air is in a direction parallel to or a direction substantially parallel to the surfaces of the first heat radiating fins 11. A portion of the base plate 10 to which a heat generating element (not shown in the drawing is thermally connected may be, for example, the center portion of the base plate 10, that is, a position of the base plate 10 corresponding to a center portion of the second heat radiating fin group 18 and a position of the base plate 10 corresponding to a center portion of the bottom portion 14c of the heat pipe 14 having a U-shape as viewed in a side view, but not particularly limited thereto.

In a case where two heat sinks 1 are installed such that the heat sinks 1 are arranged in a direction parallel to or a direction substantially parallel to the flow direction of cooling air, the height of second heat radiating fins 12 of the heat sink 1 arranged on the windward side in a flow of the cooling air is lower than the height of second heat radiating fins 12 of the heat sink 1 arranged on the leeward side in the flow of the cooling air. With such a configuration, the cooling air can be smoothly supplied also to the heat sink 1 arranged on the leeward side in the flow of the cooling air.

Next, another embodiment of the heat sink according to the present disclosure will be described. In the above-mentioned respective embodiments, the second heat radiating fins are arranged such that the surfaces of the second heat radiating fins extend in the direction orthogonal to the surfaces of the first heat radiating fins. However, it is sufficient that the surfaces of the second heat radiating fins and the surfaces of the first heat radiating fins are not parallel to each other. For example, the second heat radiating fins may be disposed to extend from the base plate such that the surface of each second heat radiating fin makes an angle other than a vertical angle, that is, an angle of greater than 0° and less than 90° (for example, greater than or equal to 70° and less than 90°) with respect to the first face of the base plate. Alternatively, the first heat radiating fins and/or the third heat radiating fins may be arranged such that the surface of each first heat radiating fin and/or the surface of each third heat radiating fin make an angle at which the first heat radiating fins and/or the third heat radiating fins are not parallel to the first face of the base plate in the arrangement direction of the second heat radiating fins. That is, the first heat radiating fins and/or the third heat radiating fins may be arranged such that the surface of each first heat radiating fin and/or the surface of each third heat radiating fin make an angle of greater than 0° and less than 90° with respect to the first face of the base plate (for example, an angle of greater than 0° and less than 30° with respect to the first face of the base plate) in the arrangement direction of the second heat radiating fins.

Further, in the heat sinks according to the first, second and fourth embodiments, the straight portions of the heat pipes having the same shape and the same size are disposed on the base plate side by side to extend substantially perpendicularly to the base plate. However, three or more heat pipes may be provided, and the heat pipes may be installed such that the straight portions of the heat pipes are arranged in a staggered manner so that the cooling air flows smoothly in a heat sink.

The heat pipes are used in the above-mentioned first to fourth embodiments. However, in place of the heat pipes or together with the heat pipes, metal (for example, aluminum, copper or the like) having thermal conductivity of greater than or 100 W/(m·K) or more at 25° C. may be used. In the above-mentioned respective embodiments, a fin pitch in each group of heat radiating fins is regularly spaced. However, the heat radiating fins in the group of heat radiating fins may not be arranged at regular intervals. The heat radiating fins may be arranged such that some heat radiating fins are omitted from a plurality of heat radiating fins arranged at regular intervals. With such an arrangement in which some heat radiating fins are omitted, larger amount of cooling air can be supplied to the leeward side.

In the above-mentioned respective embodiments, a shape of each second heat radiating fin is a flat plate shape. However, to enable joining of each second heat radiating fin to the base plate, the second heat radiating fin may have an L shape or a sideways-open U-shape as necessary.

EXAMPLE

Next, examples of the present disclosure will be described. However, the present disclosure is not limited thereto as long as those examples do not depart from the gist of the present disclosure.

Figure 7A:
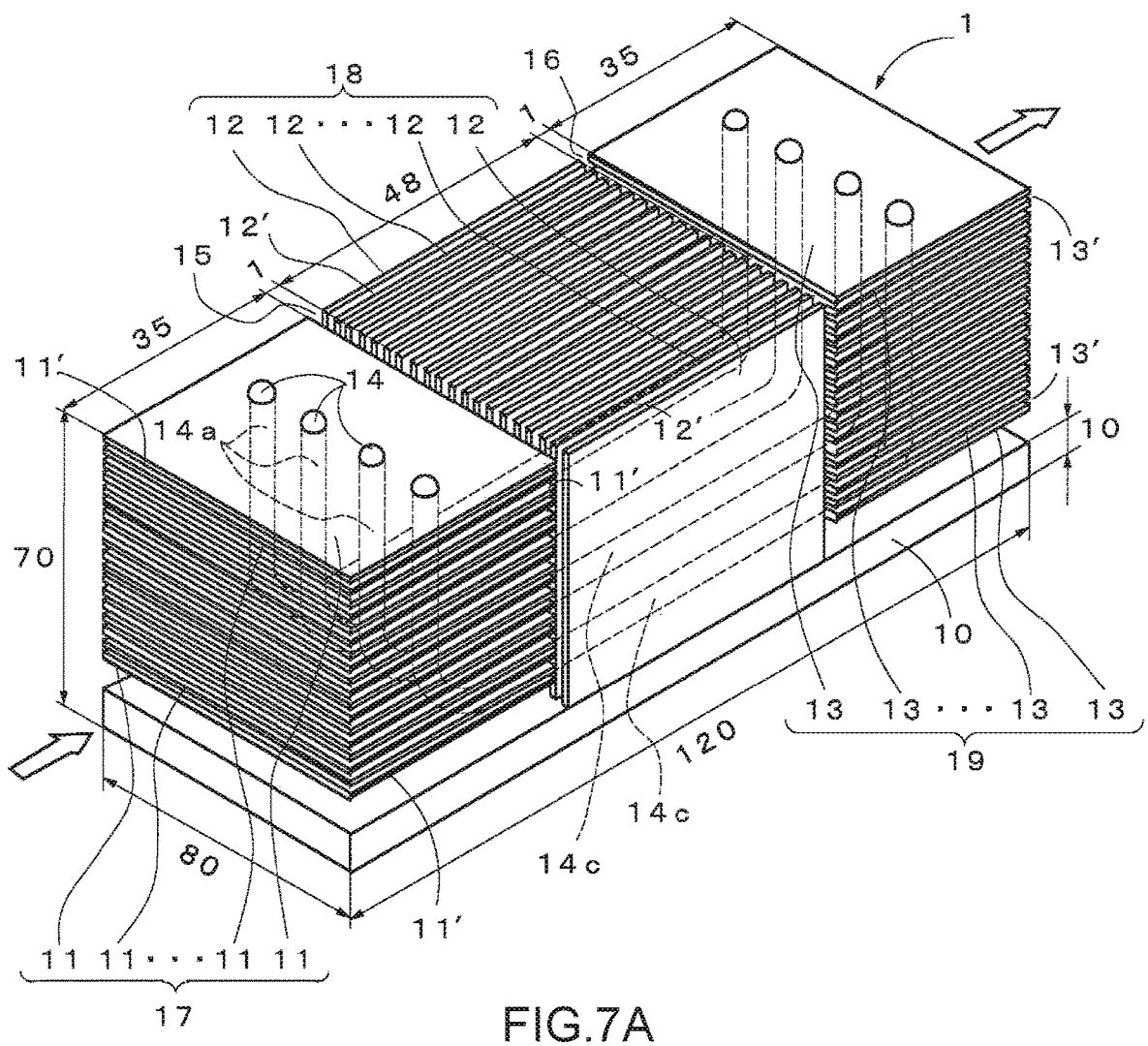
FIG. 7A is an explanatory view of a heat sink used in Example 1.
Figure 7B:
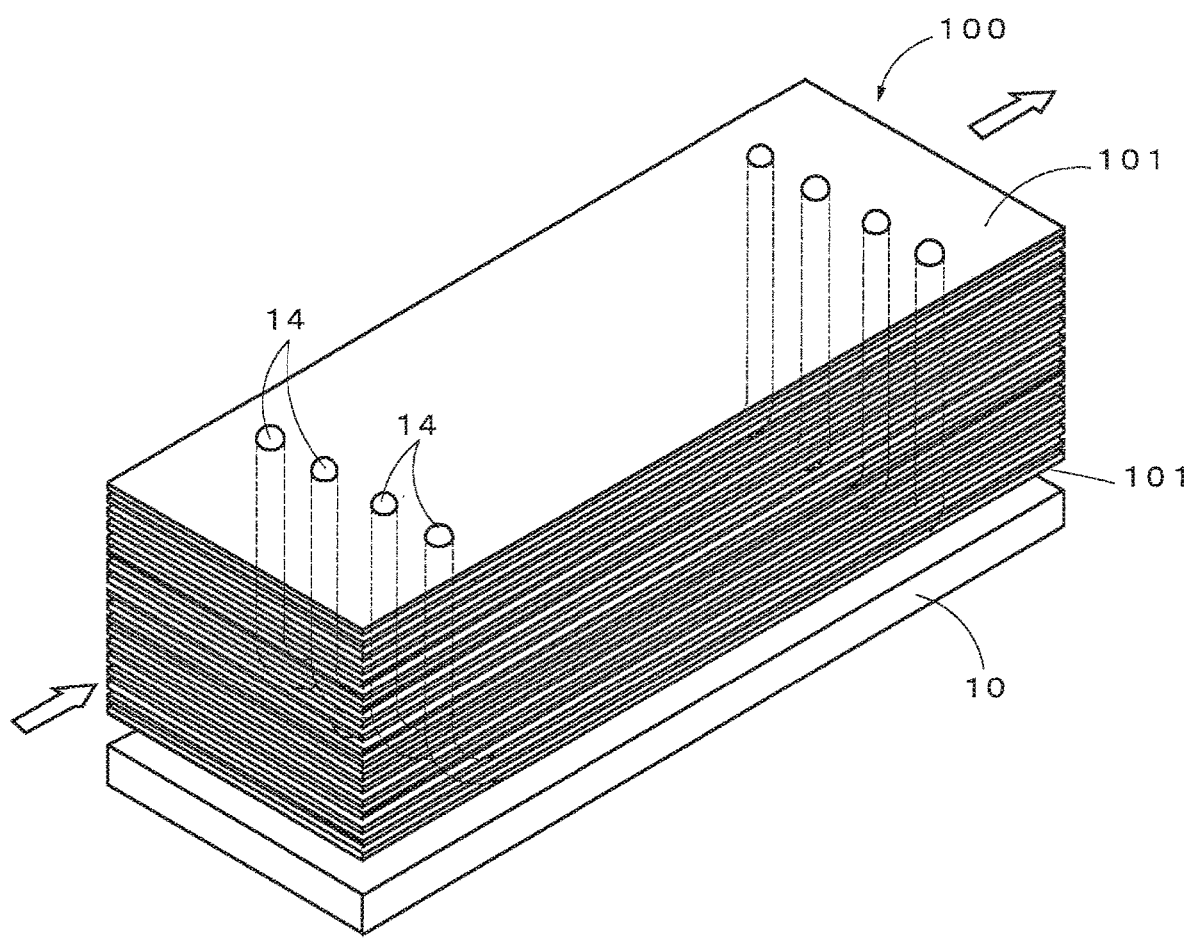
FIG. 7B is an explanatory view of a heat sink used in Comparative Example 1.

As shown in FIG. 7A, as Example 1, cooling performance was evaluated using the heat sink 1 according to the first embodiment. In Example 1, four heat pipes 14 having a U-shape as viewed in a side view were installed. Specifications for the heat sink 1 shown in FIG. 7A are as follows.
Heat Sink 1
Height of heat sink 1 (size between second face of base plate 10 and uppermost first heat radiating fin 11 and also uppermost third heat radiating fin 13): 70 mm
Group of First Heat Radiating Fins 17
Size of first heat radiating fin 11: length of 35 mm×width of 80 mm×thickness of 0.3 mm
Fin pitch: 1.6 mm
Number of first heat radiating fins 11: 30 fins
Material forming first heat radiating fin 11: copper
Group of Second Heat Radiating Fins 18
Size of second heat radiating fin 12: height of 60 mm×length of 48 mm×thickness of 0.4 mm
Fin pitch: 2.5 mm
Number of second heat radiating fins 2: 31 fins
Material forming second heat radiating fin 12: copper
Group of Third Heat Radiating Fins 19
Size of third heat radiating fin 13: length of 35 mm×width of 80 mm×thickness of 0.3 mm
Fin pitch: 1.6 mm
Number of third heat radiating fins 13: 30 fins
Material forming third heat radiating fin 13: copper
base Plate 10
Size of base plate 10: width of 80 mm×length of 120 mm×thickness of 10 mm
Material for forming base plate 10: copper
Heat Pipe 14 Having U-shape as Viewed in Side View
Diameter: 8 mm As shown in FIG. 7B, specifications for a heat sink 100 of Comparative Example 1 was substantially equivalent to the specifications for Example 1 except that, in place of the first heat radiating fins 11, the second heat radiating fins 12 and the third heat radiating fins 13 of Example 1, thirty heat radiating fins 101 (length of 120 mm×width of 80 mm×thickness of 0.3 mm, pitch of fin: 1.6 mm), each being a single plate, were used. The heat radiating fins 101 were disposed such that surfaces of the heat radiating fins 101 were parallel to a first face of a base plate.

Test Conditions

A heat generating element (CPU) not shown in the drawing and having a size of 25 mm×25 mm was connected to a center portion on a second face side of the base plate, and heat input to the heat sink was set to 200 W. In Example 1, cooling air was supplied from the first heat radiating fin group 17 side to the third heat radiating fin group 19 side. In Comparative Example 1, cooling air was supplied parallel to the first face of the base plate in a direction parallel to the longitudinal direction of the heat radiating fins. An air volume of cooling air supplied to the heat sink was 30 cfm. An atmospheric temperature in the test was 30° C.

Results of Cooling Performance Test

In Example 1, the heat generating element was cooled to 68.1° C. On the other hand, in Comparative Example 1, the heat generating element was cooled only to 79.0° C. This is because, in Example 1, as compared to Comparative Example 1, separation of a boundary layer is promoted between the first heat radiating fins 11 and the second heat radiating fins 12 and between the second heat radiating fins 12 and the third heat radiating fins 13 and hence, heat radiation efficiency of the heat radiating fins is enhanced. This is also because, in Example 1, the first heat radiating fins 11 and the second heat radiating fins 12 are disposed in a lattice arrangement as viewed in a front view, and the second heat radiating fins 12 and the third heat radiating fins 13 are disposed in a lattice arrangement as viewed in a back view and hence, a pressure loss of cooling air can be suppressed. Further, cooling air is agitated between the first heat radiating fins 11 and the second heat radiating fins 12 and between the second heat radiating fins 12 and the third heat radiating fins 13. Accordingly, a rate of heat transfer between the heat radiating fins and the cooling air can be enhanced.

Figure 8:
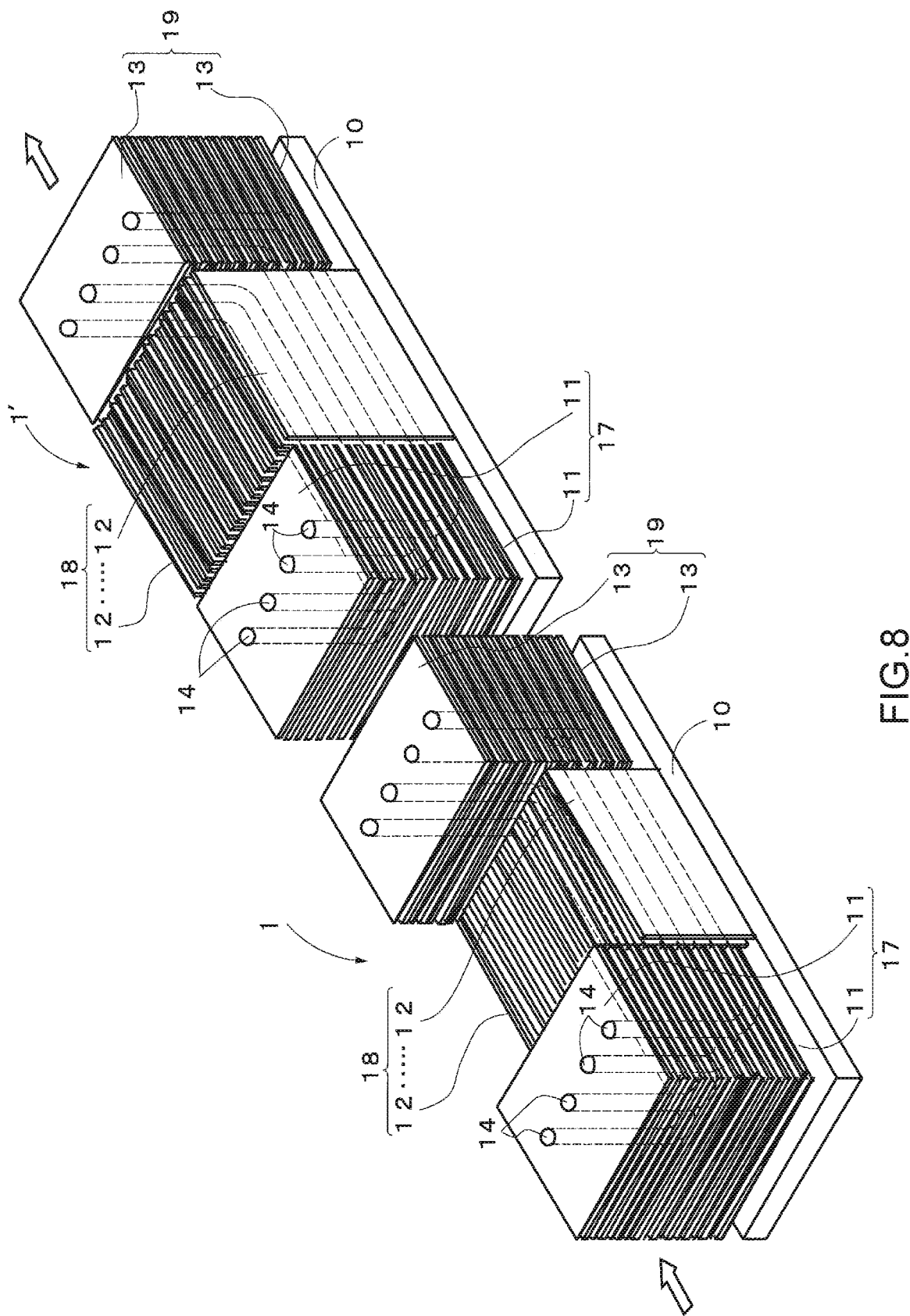
FIG. 8 is an explanatory view of a heat sink used in Example 2.

Next, as shown in FIG. 8 and FIG. 9, two heat sinks 1 according to the first embodiment used in Example 1 were installed such that the heat sinks were disposed adjacently to each other in the direction parallel to the flow direction of cooling air, and cooling performance was evaluated. That is, two heat sink were installed such that a third heat radiating fin group 19 of one heat sink 1 installed on the windward side in a flow of cooling air is disposed adjacently to a first heat radiating fin group 17 of the other heat sink 1' installed on the leeward side of the flow of the cooling air.

As shown in FIG. 8, in Example 2, a specification of one heat sink 1 installed on the windward side in the flow of cooling air was set substantially equivalent to the specification in Example 1 except for that the height of second heat radiating fins 12 was changed from 60 mm to 40 mm, and a specification of the other heat sink 1' installed on the leeward side in the flow of cooling air was set substantially equivalent to the specification in Example 1. On the other hand, as shown in FIG. 9, in Example 3, both of a specification of one heat sink 1 and a specification of the other heat sink 1' were set substantially equivalent to the specification in Example 1.

Test conditions were set to be equivalent to the test conditions in the above-mentioned Example 1 and Comparative Example 1. Cooling air was supplied parallel to the first face of a base plate 10 from the side of the first heat radiating fin group 17 of one heat sink 1 toward the side of the third heat radiating fin group 19 of the other heat sink 1'.

Results of Cooling Performance Test

In Example 2, a heat generating element (CPU) not shown in the drawing connected to the base plate 10 of one heat sink 1 was cooled to 76.7° C., and a heat generating element (CPU) not shown in the drawing connected to the base plate 10 of the other heat sink 1' was cooled to 82.4° C. Accordingly, a temperature difference between the heat generating element connected to the base plate 10 of one heat sink 1 and the heat generating element connected to the base plate 10 of the other heat sink 1' was 5.7° C. On the other hand, in Example 3, a heat generating element (CPU) not shown in the drawing connected to a base plate 10 of one heat sink 1 was cooled to 75.4° C., and a heat generating element (CPU) not shown in the drawing connected to a base plate 10 of the other heat sink 1' was cooled to 85.0° C. Accordingly, a temperature difference between the above-mentioned heat generating elements was 9.6° C. In view of the above, by setting the height of the second heat radiating fins 12 of one heat sink 1 installed on the windward side lower than the height of the second heat radiating fins 12 of the other heat sink 1' installed on the leeward side, cooling air could be smoothly supplied also to the other heat sink 1' arranged on the leeward side. As a result, the above-mentioned temperature difference between the heat generating elements (CPU) could be reduced.

According to the heat sink of the present disclosure, the formation of a boundary layer on surfaces of the heat radiating fins is suppressed so that a rate of heat transfer between the heat radiating fins and cooling air is enhanced and hence, excellent heat radiation efficiency can be exhibited. Accordingly, the heat sink of the present disclosure is applicable in wide-range of fields. For example, the heat sink of the present disclosure has a high utility value in a field of cooling an electronic component mounted on a mobile body such as a railway vehicle, an aircraft or an automobile, or an electronic apparatus.

What is claimed is:

1. A heat sink comprising:
a base plate thermally connectable to a heat generating element and having a flat plate shape;
a first heat radiating fin thermally connected to the base plate and mounted on a heat conductive member having a U-shape as viewed in a side view;
a second heat radiating fin disposed adjacently to a side end portion of the first heat radiating fin and not mounted on the heat conductive member and thermally connected to the base plate only by an end portion of the second heat radiating fin mounted on the base plate; and
a third heat radiating fin disposed adjacently to a side end portion of the second heat radiating fin and thermally connected to the base plate and mounted on the heat conductive member,
a bottom portion of the heat conductive member having a U-shape as viewed in a side view is in direct contact with the base plate such that the heat conductive member having a U-shape as viewed in a side view is thermally connected to the base plate,
the second heat radiating fin is arranged in a region where the bottom portion of the heat conductive member having a U-shape as viewed in a side view is attached,
the end portion of the second heat radiating fin is brought into direct contact with a first face side of the base plate and thus the heat generating element is thermally connected to a second face side of a center portion of the base plate,
wherein a surface of the first heat radiating fin is not parallel to a surface of the second heat radiating fin and a surface of the third heat radiating fin is not parallel to a surface of the second heat radiating fin, and wherein cooling air is configured to be supplied to the heat sink from a first heat radiating fin group side or a third heat radiating fin group side in a direction in which the first heat radiating fin group, a second heat radiating fin group and the third heat radiating fin group are arranged along a direction of airflow such that, during operation, cooling air flows through a surface of the first heat radiating fin group side or a surface of the third heat radiating fin group side, then the surface of the second heat radiating fin group, and then the surface of the third heat radiating fin group are arranged along a direction of airflow such that, during operation, cooling air flows through a surface of the first heat radiating fin group side or a surface of the third heat radiating fin group side, then the surface of the second heat radiating fin group, and then the surface of the third heat radiating fin group side or the surface of the first heat radiating fin group side, respectively;
the heat conductive member is attached to the base plate in a region of the base plate where an end portion of the second heat radiating fin is attached,
the heat generating element is thermally connectable to a region of the base plate where an end portion of the second heat radiating fin is attached.

2. The heat sink according to claim 1, wherein the heat conductive member is a heat pipe.

3. The heat sink according to claim 1, wherein an end portion of the second heat radiating fin is in direct contact with the base plate so that the second heat radiating fin is thermally connected to the base plate.

4. The heat sink according to claim 1, wherein a plurality of the first heat radiating fins and a plurality of the third heat radiating fins are arranged in a direction vertical with respect to a surface of the base plate and a plurality of the second heat radiating fins are arranged in a direction parallel to a surface of the base plate.

5. A heat sink comprising two heat sinks as claimed in claim 1, a height of a second heat radiating fin of the heat sink arranged on a windward side in a flow of a cooling air is lower than a height of a second heat radiating fin of the heat sink arranged on a leeward side in a flow of a cooling air.

6. The heat sink according to claim 1, wherein the second heat radiating fin is thermally connected to the base plate only at a region where the end portions of the second heat radiating fin is attached to the first face side of the base plate, and the second heat radiating fin is arranged such that the surface of the second heat radiating fin is vertical with respect to the first face of the base plate.

7. The heat sink according to claim 1, wherein during operation, cooling air is agitated between the first heat radiating fin and the second heat radiating fin and between the second heat radiating fin and the third heat radiating fin.

\* \* \* \* \*